United States Patent
Perthold et al.

(10) Patent No.: US 7,170,951 B1
(45) Date of Patent: Jan. 30, 2007

(54) DEVICE AND METHOD FOR PREDISTORTING A TRANSMISSION SIGNAL TO BE TRANSMITTED VIA A NONLINEAR TRANSMISSION PATH

(75) Inventors: Rainer Perthold, Weisendorf (DE); Maximilian Hofman, Erlangen (DE); Ingo Rogalsky, Erlangen (DE); Heinz Gerhafuser, Waischenfeld (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 10/018,755

(22) PCT Filed: May 19, 2000

(86) PCT No.: PCT/EP00/04580

§ 371 (c)(1),
(2), (4) Date: Apr. 30, 2002

(87) PCT Pub. No.: WO00/79679

PCT Pub. Date: Dec. 28, 2000

(30) Foreign Application Priority Data

Jun. 18, 1999 (DE) ................. 199 27 952

(51) Int. Cl.
  H04K 1/02 (2006.01)
  H04L 25/03 (2006.01)
  H04L 25/49 (2006.01)
(52) U.S. Cl. .................................. 375/296

(58) Field of Classification Search ................ 375/254, 375/278, 284, 285, 296, 297; 332/107, 123, 332/159, 162; 329/318–20, 349; 455/501, 455/63.1, 67.3, 295, 114.3; 330/268, 274; 398/193, 159

See application file for complete search history.

(56) References Cited

U.S. PATENT DOCUMENTS 3,732,502 A 5/1973 Seidel (Continued)

FOREIGN PATENT DOCUMENTS

DE 3423484 C2 10/1985

(Continued)

OTHER PUBLICATIONS

Translated PCT Search Report; International Application No. PCT/EP00/04580; dated Oct. 1, 2001; pp. 1-6.

Primary Examiner—Mohammed Ghayour
Assistant Examiner—Aslan Ettehadieh
(74) Attorney, Agent, or Firm—Vedder, Price, Kaufman & Kammholz, P.C.

(57) ABSTRACT

A device for predistorting a transmission signal to be transmitted over a nonlinear transmission path comprises an estimator for determining an error signal depending on the transmission signal and a previously registered transfer characteristic of the nonlinear transmission path. The error signal represents an estimate of an error generated due to the nonlinearity of the trans-mission path. A time-dispersive element is provided to produce a correction signal by a temporal extension of the error signal. A combiner is provided to combine the transmission signal and the correction signal. As a result of the temporal extension of the error signal, an error signal segment in the frequency spectrum of a transmission signal transmitted by the nonlinear transmission path is shifted away from the useful frequency range of the transmission signal.

17 Claims, 5 Drawing Sheets

U.S. PATENT DOCUMENTS

| | | | |
|---|---|---|---|
| 4,276,514 A | 6/1981 | Huang | |
| 4,465,980 A | 8/1984 | Huang | |
| 4,674,125 A | 6/1987 | Carlson et al. | |
| 5,023,937 A | 6/1991 | Opas | |
| 5,049,832 A * | 9/1991 | Cavers | 330/149 |
| 5,113,414 A | 5/1992 | Karam et al. | |
| 5,699,383 A * | 12/1997 | Ichiyoshi | 375/297 |
| 5,867,065 A * | 2/1999 | Leyendecker | 330/149 |
| 5,963,091 A * | 10/1999 | Chen et al. | 330/151 |
| 6,275,685 B1 * | 8/2001 | Wessel et al. | 455/126 |
| 6,314,142 B1 | 11/2001 | Perthold et al. | |
| 6,614,854 B1 * | 9/2003 | Chow et al. | 375/297 |

FOREIGN PATENT DOCUMENTS

| | | |
|---|---|---|
| DE | 4319216 A1 | 12/1994 |
| DE | 4326007 A1 | 9/1995 |
| DE | 19631388 A1 | 1/1998 |
| EP | 0121446 | 10/1984 |
| EP | 0312261 B1 | 3/1993 |
| EP | 0658975 A1 | 6/1995 |
| EP | 0367458 B1 | 6/1996 |
| EP | 0774833 A1 | 5/1997 |
| EP | 0844732 A1 | 5/1998 |
| GB | 2240893 A | 8/1991 |
| WO | WO 93/18581 | 9/1993 |

\* cited by examiner

DEVICE AND METHOD FOR PREDISTORTING A TRANSMISSION SIGNAL TO BE TRANSMITTED VIA A NONLINEAR TRANSMISSION PATH

BACKGROUND OF THE INVENTION

1. Field of the Invention

The present invention relates to a device and a method for predistorting signals to be transmitted over a nonlinear transmission path in such a way that the influence of interference segments on the useful part of the signal transmitted over the nonlinear transmission path can be optimized. The present invention may preferably be employed in transmitters for digital broadcasting, which are supplied with signals composed of a number of single carriers and which result in a non-constant envelope of a high-frequency carrier signal. It is particularly in the case of such signals that the nonlinearity of the power amplifier of an output stage of the transmitter gives rise to undesirable frequencies in the signal at the output of the power amplifier which disturb neighbouring frequency channels.

If modulation methods which lead to a non-constant envelope for the high-frequency carrier signal are used in e.g. a wireless communication system, all the signal processing components after the modulator must possess sufficient linearity. This requirement is particularly difficult to fulfil in the case of power amplifier stages designed to operate with high efficiency.

When pulse amplitude modulation methods are employed, the spectral efficiency is degraded by the nonlinearity of the amplifiers. The reason for this is to be found in the nonlinear amplitude output characteristics of an amplifier, which leads to an AM/AM conversion. Furthermore, the drift in the phase of an output signal of an amplifier compared with the phase of an input signal generates intermodulation components, which is also referred to as AM/PM conversion. The AM/AM and AM/PM conversions must be eliminated by suitable linearization methods. If this is not done, the spectral efficiency of the modulation method employed and the signal/noise ratio will be degraded. In digital transmission systems this can result in a considerable increase in the transmission bit error rate.

There thus exists the need for a suitable linearization method based on predistortion. This could be employed in all cases where in general a nonlinear transmission path is to be linearized. The linearization of a nonlinear transmission path should also permit the frequency range of the input signal into the nonlinear transmission path which is to be equalized to differ from the frequency range of the output signal from the nonlinear transmission path. The linearization must not be restricted purely to amplifier stages, therefore, but it must also be possible to perform frequency conversions within the nonlinear transmission path.

Many methods for linearizing high-frequency output stages are already known in this field of technology. The best known methods for linearizing high-frequency output stages are listed below.

2. Description of Prior Art

In digital predistortion of a signal to be transmitted, the digitally represented values of the signal are multiplied by suitably chosen coefficients. The predistortion thus takes place together with the digital generation of the control signal of the modulator.

Another known method is analog predistortion. This employs nonlinear components, e.g. Schottky diodes, to synthesize an equalization characteristic which is the complement of the amplifier distortion characteristic.

The "Cartesian loop" represents an analog negative feedback of the high-frequency output stage which is performed in the baseband.

Forward coupling (also called "feedforward") represents a disturbance-variable insertion in the sense of control engineering, a corresponding correction voltage being added to the output signal of the output stage so as to compensate for the distortion of the output stage.

In WO 93/18581 a "Cartesian loop" is described whose parameters are adjusted according to various system parameters which reflect the current operating state of the system. Here a radio transmitter comprises a power amplifier, a linearizer and a feedback device for feeding a signal from an output of the power amplifier back to the linearizer so as to ensure the linearity of the output signal. The linearizer operates in the baseband and the IQ signals are controlled by a linear control which is associated with a direct-access table which stores predetermined loop linearization parameters. After the IQ signals have been suitably processed by the linearizer, these processed signals are up-converted by an up-converter and are amplified by the power amplifier. The feedback device takes an output signal of the power amplifier, down-converts it by means of a down-converter and feeds the down-converted signal into the linearizer. The linearization does not therefore take place in the high-frequency range but in the baseband range, since use is made of the IQ signals. Furthermore, the circuit described provides a permanent negative feedback of the high-frequency output stage in the sense of a Cartesian loop.

GB 2240893 A discloses a circuit for linearizing the amplitude response and the phase response of an amplifier. An envelope detector circuit detects the envelope of an input signal to be transmitted and the output signal of the envelope detector circuit is fed into a nonlinear control circuit and into a phase shifter control circuit. The phase shifter control circuit controls a phase shifter, which precedes the power amplifier, so as to predistort the high-frequency signal phasewise. The nonlinear control circuit supplies an input signal to a variable-voltage dc—dc converter, which suitably adjusts the bias voltage parameters, i.e. the operating point of the power amplifier, so as to compensate for the distortion of the nonlinear amplifier. The amplitude error of the amplifier is thus compensated for by adjusting its operating point, which has the disadvantage that the operating point parameters of the amplifier have to be changed continually, which can make it very difficult to match the amplifier to a load since changing the operating point normally automatically entails a different (complex) transformation relationship for the output resistance.

U.S. Pat. No. 5,023,937 describes an analog predistortion circuit for a power amplifier which is operated in the nonlinear range. This predistortion operates by means of a negative feedback loop in which, in contrast to the Cartesian loop, the magnitude and phase of the output signal and not the IQ components are controlled. An envelope detector detects the amplitude of the signal to be amplified and this amplitude, via feedback, is continuously compared with the envelope of the output signal of the power amplifier. The result of the comparison is applied to a variable attenuator which suitably attenuates the input signal to the power amplifier so as to generate an output signal which is as nearly linear as possible. The phase predistortion is performed by means of a phase-locked loop which has the signal to be amplified as its input signal. Part of the output signal of the amplifier is also fed, via a converter, a local oscillator and a phase shifter circuit, into the phase-locked loop, which supplies a local oscillator signal for a converter which precedes the power amplifier and predistorts the phase of the signal to be amplified. The operation of this circuit is completely analog and is based on an essentially continuous feedback provided the phase-locked loop is locked.

U.S. Pat. No. 4,465,980 also describes an analog predistortion circuit. A detector detects the envelope of a signal to be amplified and applies this signal to a field-effect transistor having two gate terminals (dual gate FET). The signal to be amplified is applied to the other gate of the dual gate FET. By suitably controlling the operating point of this dual gate FET the HF input signal is suitably predistorted so as to compensate for the nonlinear amplification of a power amplifier which is connected to the drain terminal of the dual gate FET via a matching network.

DE 3312030 A1 discloses an amplifier with predistortion compensation which employs predistortion components generated by a power amplification element similar to the amplification element so as to achieve an effective linearization which substantially reduces all the intermodulation predistortion products. Furthermore, an additional feedback circuit can also be provided to reduce nonlinearities still further.

EP 312261 A2 discloses a linearization correction circuit which operates in an intermediate frequency range so as to introduce suitable predistortion into an amplitude envelope to compensate for the nonlinearity of the power amplifier stages. An array of parallel current sources, each of which can be adjusted via a corresponding amplitude band in reaction to a predistortion, injects a current which is sufficient to introduce a suitable difference voltage at the output. With this circuit there is obviously no phase predistortion.

EP 0 658 975 A1 relates to a baseband predistortion system for the adaptive linearization of power amplifiers and to a radio transmitter which uses the predistortion system. Here two error tables, one for the amplitude and one for the phase, are actualized and the contents thereof are used to correct the baseband sampled values. The contents of the tables are obtained by accumulating a suitably weighted difference between sampled values, which are fed into the predistortion unit, and a demodulated feedback value. As has already been described for WO93/18581, a predistortion is thus performed not in the high-frequency range but digitally in the baseband. Access to the digital signal conditioning in the baseband must be provided.

A digital predistortion as described in EP 0 658 975 A1 and in WO93/18581 involves access to the modulation signal before it is converted from a digital form to an analog voltage value in order to be able to perform the necessary digital calculations for correcting the carrier amplitude and the carrier phase. In many cases such access is not available since linearization can only be performed within the closed system of the power output stage.

In the case of analog predistortion of the high-frequency signal there is the problem of having to synthesize a suitable characteristic from nonlinear components which are subject to individual differences, temperature drift, ageing, etc. Ageing of the components may result in increased nonlinearity.

The "Cartesian loop", i.e. a high-frequency negative feedback, reacts very sensitively to parameter fluctuations. As a consequence of the high amplification there is also a strong tendency for the whole arrangement to oscillate if the feedback parameters are not determined precisely. The noise behaviour of the output stage is also seriously degraded by the negative feedback since this introduces uncorrelated noise into the amplifier stage.

The feedforward method requires a precise determination of the signal propagation times of the output stage. The linearization demands made on the correction signal are high, which means that technically advanced, costly power amplifiers must be used in a circuit which performs linearization according to the feedforward method.

A method for the additive correction of an OFDM signal is also known from the article "Reduktion von Nachbarkanal-störungen in OFDM-Funkubertragungssystemen" by Thomas May, Hermann Rohling, TU Braunschweig, Schleinitzstrasse 22, 38092 Braunschweig. In this method the OFDM baseband signal is corrected by means of a suitable auxiliary function to counter-act nonlinearities caused by a subsequent amplifier. The auxiliary function is a suitably adapted si function which ensures that there is no adjacent channel interference since the interference power is concentrated on the OFDM bandwidth so that there is practically no out-of-band radiation.

Also known from DE 19631388 A1 is a system for predistortion for a nonlinear transmission path in the high-frequency range where the envelope of a signal to be transmitted over a nonlinear transmission path is detected, whereupon quantized envelope values are formed. Complex predistortion coefficients, which depend on the quantized envelope values and on a transfer function of the nonlinear transmission path registered beforehand, are stored in a table unit. In addition an evaluator is provided, e.g. an IQ modulator, via which the signal to be transmitted is modulated with the complex predistortion coefficients prior to transmission of the signal over the nonlinear transmission path in such a way that the predistortion caused by the nonlinear transmission path is substantially compensated for as regards magnitude and phase. It has turned out, however, that complete compensation is scarcely achievable with this system and furthermore interference segments still remain in the immediate neighbourhood of the useful channel of the transmission signal. Much is therefore required of a bandpass filter at the far end of the nonlinear transmission path.

In most of the known methods described above for linearizing high-frequency output stages the aim is to reduce the effect of the nonlinearity of the amplifier by providing it with a suitably predistorted input signal. In this way a nonlinear behaviour of the combination predistorter/amplifier within the permissible dynamic range can be achieved. The known predistiorters remember nothing. As soon as the amplifier is so strongly driven for a short time that it acts as a limiter, the predistortion becomes ineffective. The feedforward methods which have also been described represent a disturbance-variable insertion in the sense of control engineering, as already mentioned, a disadvantage being that an amplifier with a performce almost equal to that of the amplifier to be linearized is needed to generate the correction signal.

For input signals with a high crest factor, which occur e.g. in multicarrier methods, the known methods are ineffective since the power amplifier momentarily enters the limiting region.

SUMMARY OF THE INVENTION

It is the object of the present invention to provide a novel device and a novel method for predistorting a transmission signal to be transmitted over a nonlinear transmission path which permit a predistortion of the signal to be transmitted such that the influence on the useful part of the signal of interference segments produced by a nonlinear transmission path can be minimized and also to provide a high-frequency transmitter and a method for the spectral shaping of an interference spectrum of a transmission signal using such a device and such a method.

According to a first aspect of the present invention this device for predistorting a transmission signal to be transmitted over a nonlinear transmission path which has an estimator for determining an error signal depending on the transmission signal and on a previously registered transfer characteristic of the nonlinear transmission path. The error signal represents an estimate of an error generated by the nonlinearity of the transmission path. A time-dispersive element is provided to generate a correction signal through temporal extension of the error signal. The correction signal is combined with the transmission signal in a combiner. As a result of the temporal extension of the error signal an error signal segment in the frequency spectrum of a transmission signal transmitted by the nonlinear transmission path is shifted away from the useful frequency range of the transmission signal.

According to a second aspect of the present invention this object is achieved by a high-frequency transmitter comprising:

a predistorter for predistorting a transmission signal to be transmitted over a nonlinear transmission path, said predistorter comprising:

an estimator for determining an error signal depending on the transmission signal and a previously registered transfer characteristic of the nonlinear transmission path, where the error signal represents an estimate of an error generated due to the nonlinearity of the transmission path;

a time-dispersive element for generating a correction signal by a temporal extension of the error signal; and a combiner for combining the transmission signal and the correction signal, wherein, due to the temporal extension of the error signal, an error signal segment in the frequency spectrum of a transmission signal transmitted by the nonlinear transmission path is shifted away from the useful frequency range of the signal;

a power amplifier for amplifying a transmission signal which has been predistorted by the predistorter; and a bandpass filter which succeeds the power amplifier and whose transmission band is adjusted to the useful frequency range of the transmission signal.

According to a third aspect of the present invention this object is achieved by a method for predistorting a transmission signal to be transmitted over a nonlinear transmission path, comprising the following steps:

generating an error signal from the transmission signal to be transmitted and a previously registered transfer characteristic of the nonlinear transmission path, wherein the error signal represents an estimate of an error generated due to the nonlinearity of the transmission path;

effecting a temporal extension of the error signal to generate a correction signal;

combining the correction signal and the transmission signal to be transmitted to generate a predistorted transmission signal, wherein, due to the temporal extension of the error signal, an error signal segment in the frequency spectrum of a transmission signal transmitted by the nonlinear transmission path is shifted away from the useful frequency range of the transmission signal.

According to a fourth aspect this object is achieved by a method for spectrally forming an interference spectrum of a transmission signal at the output of a power transmitter, said method comprising the steps of:

generating an error signal from the transmission signal and a previously registered transfer characteristic of a power amplifier, wherein the error signal represents an estimate of an error generated due to a nonlinearity of the power amplifier;

effecting a temporal extension of the error signal to generate a correction signal;

combining the correction signal and the transmission signal to generate a predistorted transmission signal, wherein, due to the temporal extension of the error signal, an error signal segment in the frequency spectrum of a transmission signal transmitted by the power amplifier is shifted away from the useful frequency range of the transmission signal; and feeding the predistorted transmission signal (S1') into the power amplifier.

The present invention differs from known proposals in that no attempt is made to avoid limitation of the amplifier by linearizing it. Instead the spectral distribution of the resulting interference is modified in such a way that it can be reduced or minimized quite simply by means of a bandpass filter following the amplifier. The predistortion according to the present invention thus effects a spectral shaping of the interference spectrum at the output of a nonlinear transmission path. The present invention is particularly suitable for use in transmitters used to transmit signals modulated by multicarrier methods, e.g. transmitters for digital broadcasting. In such transmitters the bandpass filter referred to above is normally already present at the output of the power amplifier.

According to the present invention the shaping of the interference spectrum at the output of a nonlinear transmission path is achieved in that an estimate is first made of the error signal caused by the nonlinear transmission path, whereupon the estimated error signal is subjected to a temporal extension prior to combining it with the signal to be transmitted. Through this temporal extension interference signal segments in the frequency spectrum of the output signal of the nonlinear transmission path are shifted into a desired spectral range which is displaced from the frequency range of the useful signal.

The present invention is particularly suitable for the predistortion of signals subjected to multicarrier modulation, but it can also be used for other signals, e.g. CDMA signals, which have high crest factors.

With the present invention the energy of the error signal at the output of the nonlinear transmission path can be reduced to a minimum and the remaining energy of the error signal can appear in a desired spectral range which is shifted relative to the frequency range of the useful signal. By employing a bandpass filter at the output of the nonlinear transmission path it is thus possible with the present invention to obtain a transmission signal whose useful part is essentially free from interference segments caused by nonlinearities of the nonlinear transmission path.

Estimating the error signal, which represents an estimate of the error generated by the nonlinearity of the transmission path, can be effected in different ways. For example, it is possible to form squares of the magnitudes of the transmission signal to be transmitted. These provide the basis for accessing a table in which complex distortion coefficients are stored which depend on the squares of the magnitudes and the previously registered transfer characteristics of the nonlinear transmission path. The corresponding distortion coefficients are then combined with the transmission signal to be transmitted so as to generate the error signal. Alternatively an envelope detector for detecting the envelope of the transmission signal and a quantizer for forming quantized envelope values may be provided. These quantized envelope values again form the basis for accessing a table in which complex distortion coefficients are stored.

In the present invention the time-dispersive element is preferably a time-dispersive bandpass filter or low-pass filter in which short interference pulses are reshaped into longer interference pulses to achieve a temporal extension of the error signal. This extension then determines the spectral shaping of the interference spectrum at the output of the nonlinear transmission path as described above.

The filter coefficients of the time-dispersive bandpass filter or low-pass filter can preferably be determined in advance from the transfer characteristic of the nonlinear transmission path, e.g. by measuring the spectral power of the signal transmitted over the nonlinear transmission path and then using the power in the regions adjoining the useful frequency range as optimization criteria for the filter coefficients. Optimization of the filter coefficients can be effected using known algorithms such as e.g. the simplex algorithm. Apart from the time-dispersive bandpass filter or low-pass filter used as the preferred embodiment, other time-dispersive elements which produce a temporal extension of the estimated error signal may equally well be used.

In preferred embodiments of the present invention the transfer characteristics of the nonlinear transmission path are determined outside the operation of the predistortion device and are then used during operation to set the estimator and/or the time-dispersive element. To permit fine-tuning at particular times during operation of the predistortion device, an adapter can be provided in the present invention which enables the complex correction coefficients for the estimator or the filter coefficients for the time-dispersive filter to be adjusted to match the prevailing conditions.

The present invention provides a number of advantages over known predistortion systems. For one thing, all the signal processing can be performed digitally, so that there are no component tolerance or adjustment problems. Also, there is no need to tamper with the high-frequency part, i.e. the power amplifier or the bandpass filter which follows this. The reduced spurious emission achieved by the present invention means that substantial savings can be made as regards the power amplifier and its power supply since both can be made smaller. In addition to this, less stringent demands are made on the bandpass filter, which again lowers the costs. Compared with classical linearization methods substantially higher linearization gains in the order of 20 dB can be achieved with the present invention, as opposed to linearization gains of 5 to 8 dB with classical linearization methods.

BRIEF DESCRIPTION OF THE DRAWINGS

Preferred embodiments of the present invention are described in more detail below making reference to the drawings, in which.

DESCRIPTION OF PREFERRED
EMBODIMENTS OF THE INVENTION

A preferred embodiment of the present invention will now be described in terms of a transmitter which features a high-frequency power amplifier. It is clear, however, that the present invention can also be employed to predistort signals transmitted over other nonlinear transmission paths.

Figure 1:
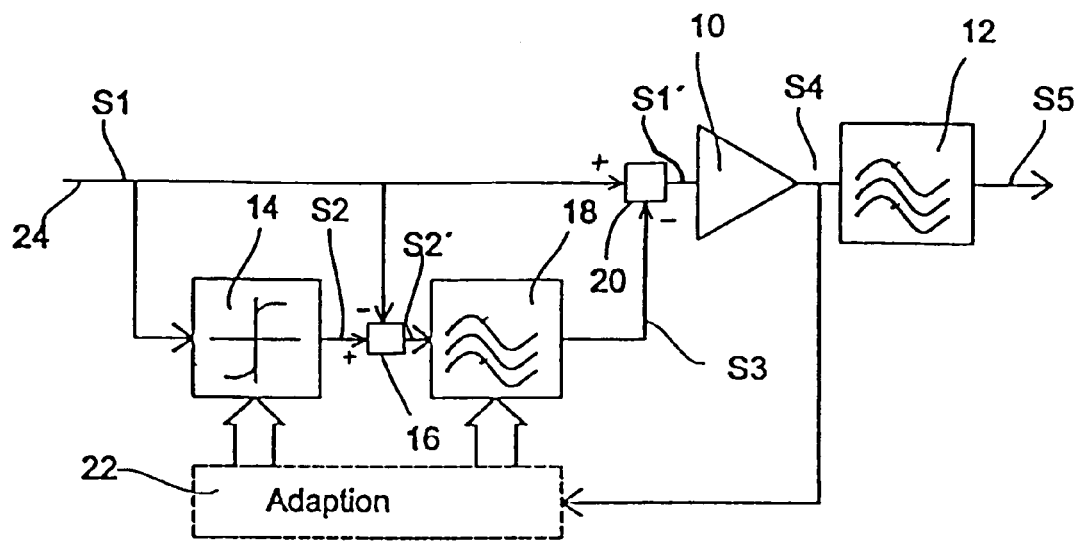
FIG. 1 shows a schematic block diagram of a transmitter, wherein the predistortion device according to the present invention is used.

FIG. 1 shows a transmitter which might be used e.g. for digital broadcasting. An input signal S1, which might be a multicarrier signal with a non-constant envelope, is fed into the transmitter. Without predistortion this input signal S1 would be fed directly into a power amplifier 10, which is followed by a narrow bandpass filter 12. However, in order to compensate for nonlinearities of the power amplifier 10, which represents a nonlinear transmission path, the input signal S1 is first predistorted. The input signal S1 is therefore first fed into an emulator 14 which emulates the nonlinear behaviour of the power amplifier 10, i.e. an AM/AM and an AM/PM conversion. The resulting signal S2 at the output of the emulator 14 represents an estimate of the signal actually supplied by the power amplifier 10 when the signal S1 is applied to it as input signal. Examples of the emulator 14 will be described below making reference to FIG. 2.

In the embodiment shown the output of the emulator 14 is connected to a combiner, shown schematically at 16 in FIG. 1. The emulator 14 and the combiner 16 represent the estimator of the predistorter according to the present invention in the embodiment shown. In the combiner the input signal S1 and the estimated signal are combined in such a way that an error signal S2' at the output of the combiner 16 represents an estimate of the error introduced by the power amplifier 10. In the embodiment shown the input signal S1 is subtracted from the estimated signal S2. The output of the combiner 16 is connected to the input of a time-dispersive filter 18. The time-dispersive filter 18 generates through temporal extension of the error signal S2' a correction signal S3. This correction signal S3 is combined with the input signal S1 in a further combiner, shown schematically at 20 in FIG. 1. In the embodiment shown the correction signal S3 is subtracted from the input signal S1. Whether a subtraction or addition is performed in the combination element depends on the filter coefficients of the time-dispersive bandpass filter or low-pass filter 18.

The output of the combiner 20 is connected to the input of the power amplifier 10. The power amplifier 10 thus amplifies the predistorted signal S1' formed by combining the input signal S1 and the correction signal S3. The signal S4 at the output of the power amplifier 10 then undergoes bandpass filtering by the bandpass filter 12 to generate the output signal S5 of the transmitter.

As is also shown in FIG. 1, an adaption device 22 can optionally be provided which captures the signal S4 output by the power amplifier 10 and uses it to determine transfer characteristics of the power amplifier 10 and to adapt the emulator 14 and the time-dispersive bandpass filter or low-pass filter 18. In addition, suitable delay elements can be incorporated in the direct signal path from the input 24 of the transmitter to the combiner 20 to compensate for the already known delay time of the predistortion according to the present invention. The predistortion is preferably synchronized by an external clock so that the delay time does not depend on parameters of any kind. In this way it is possible to compensate simply for the delay time by providing suitable delay elements in the direct path between the input 24 and the combiner 20.

Figure 2:
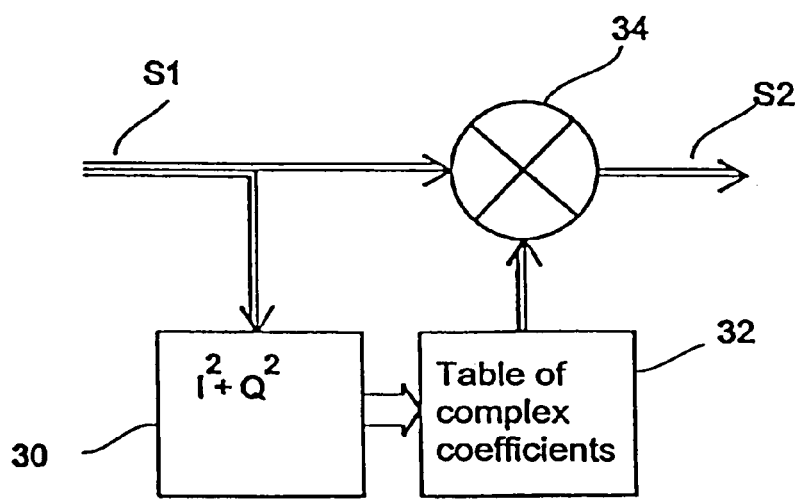
FIG. 2 shows a schematic block diagram, which shows an embodiment of an estimator.

Before discussing the mode of operation of the predistorter shown in FIG. 1 making reference to FIGS. 3 to 6, a preferred embodiment of the emulator 14 will first be described making reference to FIG. 2.

In the preferred embodiment the emulator 14 has a unit 30 for forming the squares of the magnitudes which is supplied with the input signal S1. The unit 30 forms the sum of the squares of the magnitudes of the real part 12 and the imaginary part Q2 of the input signal S1. On the basis of these squares a table 32 of complex coefficients is accessed in which complex coefficients allocated to the squares or the sum of the squares are stored. The input signal S1 is then multiplied with these complex coefficients according to the rules for complex numbers in a complex-number multiplier 34. The complex-number multiplier 34 may e.g. be an IQ modulator. The estimated signal S2 appears at the output of the complex-number multiplier 34.

The complex coefficients of table 32 are calculated and stored on the basis of the transfer characteristic of the power amplifier 10 outside the operation of the circuit. The circuit shown in FIG. 2 thus simulates the transfer characteristic of the power amplifier 10, so that the signal S2 represents an estimate of the signal which would be obtained through the power amplifier 10 if it were fed with a non-predistorted input signal S1. To obtain an error signal which represents an estimate of the error generated by the power amplifier 10 the signal S2 is combined with the signal S1, so the emulator 14 together with the combiner 16 can be regarded as an estimator for estimating the error signal.

Alternatively, the complex coefficients in the table can be so adjusted that by multiplying them directly with the signal to be transmitted a signal is output which describes the error generated by the power amplifier 10 and thus corresponds to the error signal S2'.

As an alternative to the unit for forming the squares of the magnitudes described above, an envelope detector and a quantizer for forming quantized envelope values from the detected envelope can be provided. In this case the table of complex coefficients is then accessed on the basis of the quantized envelope values. The envelope detector could be e.g. a diode rectifier and the quantizer could be e.g. an analog/digital converter.

The adaption device 22 shown in FIG. 1 can serve to produce adaptively both the coefficients of the filter 18 and the complex coefficients of table 32. The power of the spurious emission in the desired frequency range can be used to provide the optimization criterion for optimizing the filter coefficients of the time-dispersive filter. The output signal of the power amplifier 10 when the predistorter is not active can be used to generate the complex coefficients for the table 32 of the emulator 14. The filter coefficients of the time-dispersive filter 18 can also be ascertained from the output signals of the power amplifier 10 and the associated input signals when the predistorter or at least the time-dispersive filter is not active. A means of bypassing the time-dispersive filter 18 can be provided for this purpose.

The adapter 22 can also be designed so as to perform fine-tuning of the complex coefficients or filter coefficients at particular times during operation. In this case a comparator can be optionally provided which compares the input signal S1 and the output signal S4 so as to establish whether there is a linear relationship, e.g. a simple amplification, between them. If the relationship is not linear, this indicates that the ambient conditions have changed, which means that the distortion coefficients no longer have their optimal values. In a recalibration step the adapter can then access the emulator 14 and the time-dispersive filter 18 so as to appropriately modify the complex coefficients in table 32 and/or the filter coefficients of the time-dispersive filter 18.

the mode of operation of the circuit shown in FIG. 1 will now be described in more detail referring to the signal profiles in FIGS. 3 to 6.

Figure 3:
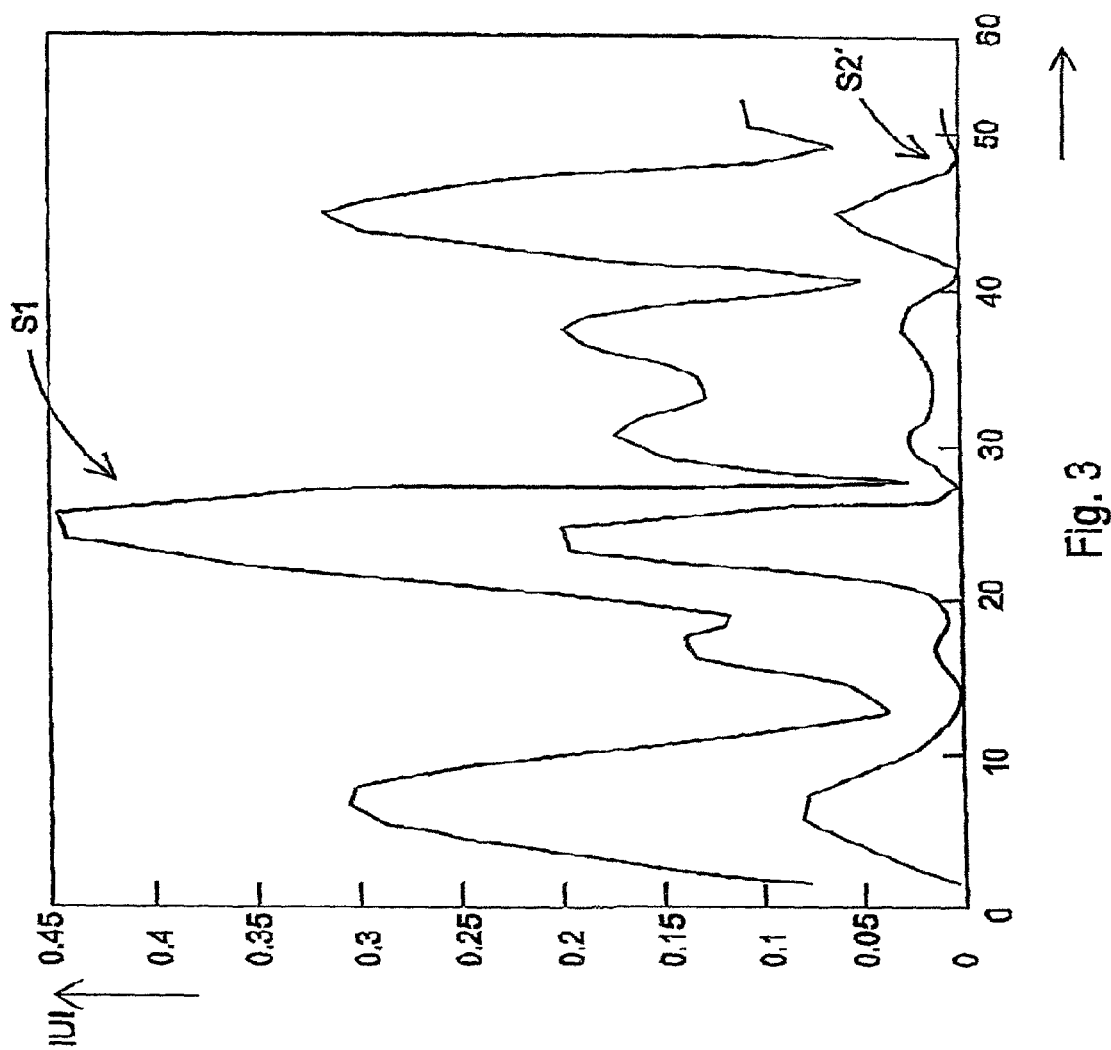
FIGS. 3 and 4 show time profiles of signals which occur when performing predistortion according to the present invention.
Figure 4:
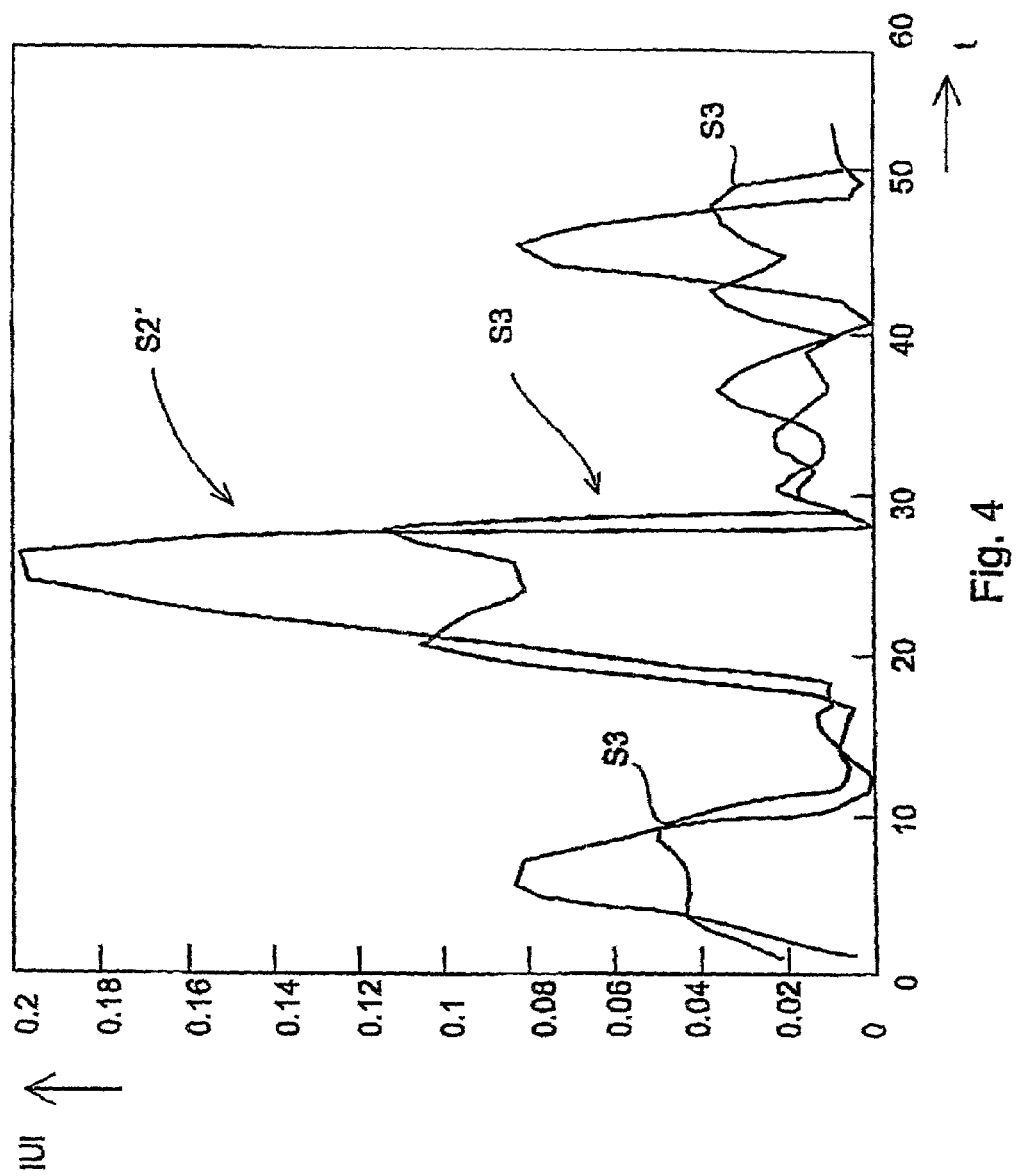

FIG. 3 shows the way in which the envelopes of a typical multicarrier signal which represents the input signal S1 vary with time (|U|, t). The numbers on the time axis represent sampled values. As can be seen from FIG. 3, the input signal S1 has a high crest factor, which for normal operation of the power amplifier 10 is large enough to bring the amplifier fully into the limitation region, so that traditional linearization is completely ineffective.

Figure 5:
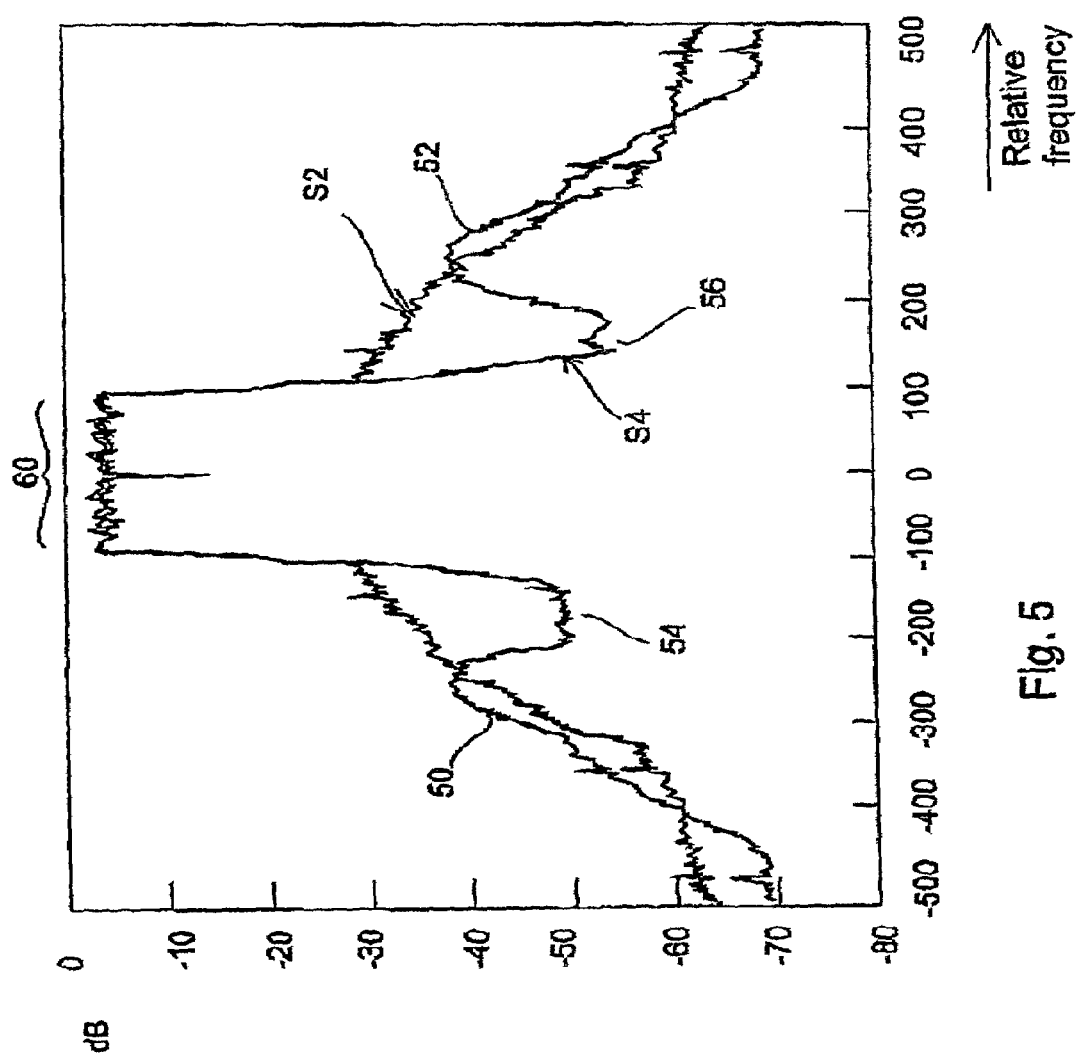
FIGS. 5 and 6 show power spectra of signals which occur when performing predistortion according to the present invention.
Figure 6:
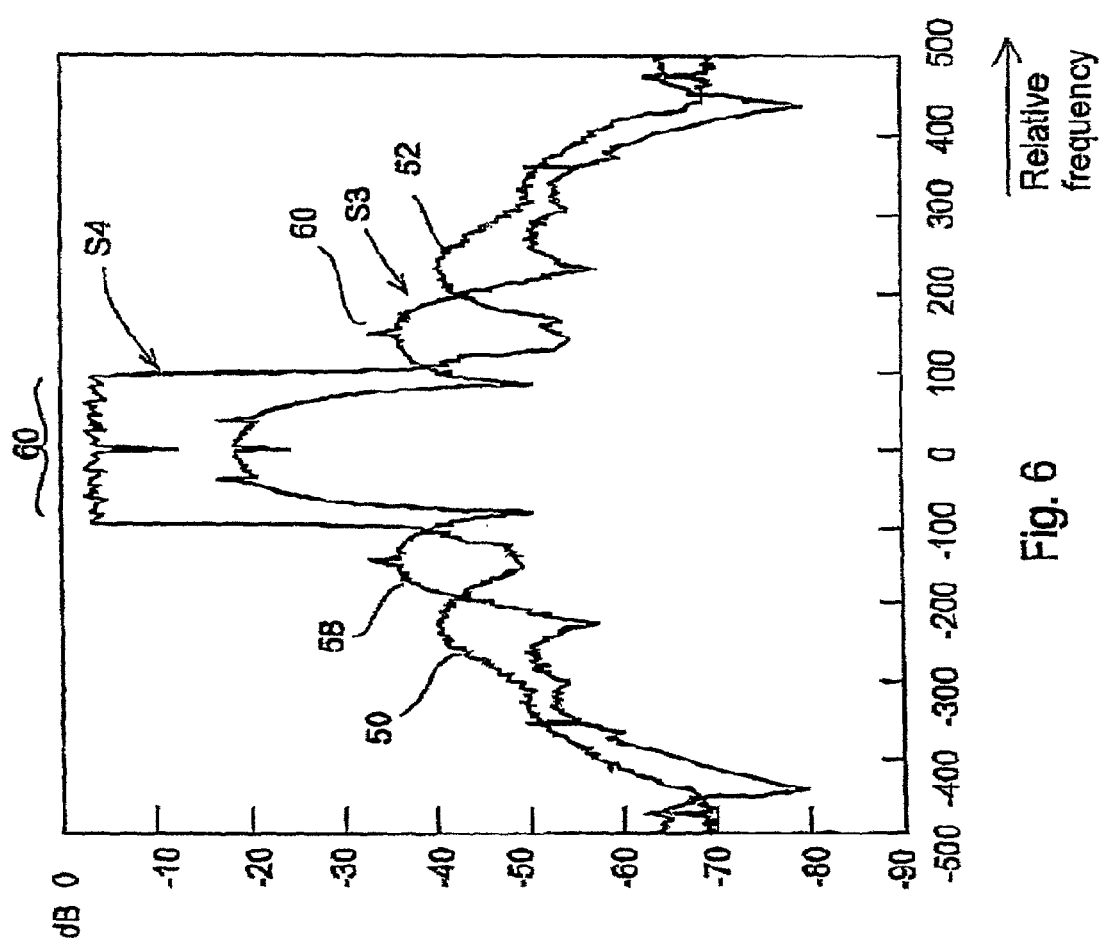

From this input signal S1 the emulator 14 and the combiner 16, which together constitute the estimator, produce a signal S2-S1, whose time profile is also shown in FIG. 3 and which represents the error signal S2'. This error signal S2' is reproduced somewhat magnified in FIG. 4. The error signal S2' is fed into the time-dispersive element where temporal extension of the signal takes place, resulting in the signal S3, also shown in FIG. 4. As can clearly be seen in FIG. 4, the signal S3 is temporally extended with respect to the error signal S2'. As described above, this correction signal S3 is now combined with the input signal S1, thus generating a predistorted input signal S1'. This predistorted input signal S1' is then fed into the nonlinear power amplifier 10. The spectrum of the output signal S4 of the power amplifier 10 is shown in FIG. 5. The unit used for the horizontal axis in FIG. 5 and in FIG. 6 is the relative frequency in terms of the centre frequency of a useful channel.

In FIG. 5 the spectrum of the signal S2 which would appear at the output of the power amplifier 10 without predistortion is shown for comparison. It can clearly be seen that the interference power of the signal S4 outside the useful range 60 is reduced compared with the signal S2 and is also distributed differently. In the embodiment shown the useful range lies between the relative frequencies of about −100 and about 100. The remaining interference segments 50 and 52 of the signal S4 fall outside this useful range, being separated from it by the intervening regions 54 and 56. This shifting of the interference segments 50 and 52 away from the useful range results from the temporal extension of the error signal S2' to generate the correction signal S3. This is particularly apparent in FIG. 6, which again shows the spectrum of the signal S4 and also the spectrum of the correction signal S3. As can be seen, the spectrum of the correction signal S3 has bumps 58 and 60 in the region of the channels directly adjoining the useful channel 60, so that subtracting the signal S3 from the input signal S1 in these regions results in an increased attenuation. As a result the interference segments 50 and 52 are shifted away from the useful frequency range.

The shifting of the interference segments 50 and 52 away from the useful frequency range means that the power amplifier 10 can be followed by a bandpass filter 12 which is subject to less stringent requirements as regards its transmission characteristic than if the interference signal segments were located directly adjacent to the useful frequency range. By shifting the interference signal energy into a desired spectral range outside the useful frequency range and minimizing the energy of the error signal at the output of the power amplifier by estimating the error by means of the estimator, the present invention makes it possible to manufacture relatively cheap transmitters, since both the power amplifier and its power supply can be made smaller and it is possible to use a bandpass filter with less stringent requirements.

The invention claimed is:

1. A device for predistorting a transmission signal to be transmitted over a nonlinear transmission path, comprising:
   an estimator for determining an error signal depending on the transmission signal and a previously registered transfer characteristic of the nonlinear transmission path, where the error signal represents an estimate of an error generated due to the nonlinearity of the transmission path, and wherein the error signal is generated by combining the transmission signal with distortion coefficients obtained by accessing the previously registered transfer characteristic based on the transmission signal;
   a time-dispersive element for generating a correction signal by a temporal extension of the error signal; and
   a combiner for combining the transmission signal and the correction signal,
   wherein, due to the temporal extension of the error signal, an error signal segment in the frequency spectrum of a transmission signal transmitted by the nonlinear transmission path is shifted away from the useful frequency range of the signal.

2. A device according to claim 1, wherein the nonlinear transmission path is a power amplifier.

3. A device according to claim 1, wherein the estimator has a unit for forming the squares of the magnitudes of the transmission signal to be transmitted and a table for supplying complex distortion coefficients, which depend on the squares of the magnitudes and on the previously registered transfer characteristic of the nonlinear transmission path.

4. A device according to claim 3, wherein the unit for forming the squares of the magnitudes of the real and the imaginary part of the transmission signal is provided.

5. A device according to claim 3 wherein the estimator also includes a unit for combining the squares of the magnitudes or of the envelope values and the complex coefficients for generating the error signal.

6. A device according to claim 1, wherein the estimator has an envelope detector for detecting the envelope of the transmission signal, a quantizer for forming quantized envelope values and a table unit for supplying complex distortion coefficients which depend on the quantized envelope values and on the previously registered transfer characteristic of the nonlinear trans-mission path.

7. A device according to claim 1, wherein the time-dispersive element is a time-dispersive bandpass filter or low-pass filter.

8. A device according to claim 7, wherein an adapter is provided which, on the basis of a signal to be transmitted and an output signal output by a nonlinear transmission path if there is no predistortion, ascertains the transfer characteristic of the nonlinear transmission path and uses this to control the estimator and/or the filter coefficients of the time-dispersive bandpass filter or low-pass filter.

9. A device according to claim 8, wherein the adapter ascertains the transfer characteristic at predetermined times.

10. A device according to claim 1, wherein coefficients of the time-dispersive element are determined in advance from the transfer characteristic of the nonlinear transmission path.

11. A high-frequency transmitter comprising:
   a predistorter for predistorting a transmission signal to be transmitted over a nonlinear transmission path, said predistorter comprising:
   an estimator for determining an error signal depending on the transmission signal and a previously registered transfer characteristic of the nonlinear transmission path, where the error signal represents an estimate of an error generated due to the nonlinearity of the transmission path, and wherein the error signal is generated by combining the transmission signal with distortion coefficients obtained by accessing the previously registered transfer characteristic based on the transmission signal;
   a time-dispersive element for generating a correction signal by a temporal extension of the error signal; and
   a combiner for combining the transmission signal and the correction signal,
   wherein, due to the temporal extension of the error signal, an error signal segment in the frequency spectrum of a transmission signal transmitted by the nonlinear transmission path is shifted away from the useful frequency range of the signal;
   a power amplifier for amplifying the transmission signal which has been predistorted by the predistorter; and
   a bandpass filter which succeeds the power amplifier and whose transmission band is adjusted to the useful frequency range of the transmission signal.

12. A high-frequency transmitter according to claim 11, wherein coefficients of the time-dispersive element are determined in advance from the transfer characteristic of the nonlinear transmission path.

13. A method for predistorting a transmission signal to be transmitted over a nonlinear transmission path, comprising the following steps:
   generating an error signal from the transmission signal to be transmitted and a previously registered transfer characteristic of the nonlinear transmission path, wherein the error signal represents an estimate of an error generated due to the nonlinearity of the transmission path, and wherein the error signal is generated by combining the transmission signal with distortion coefficients obtained by accessing the previously registered transfer characteristic based on the transmission signal;
   effecting a temporal extension of the error signal to generate a correction signal;
   combining the correction signal and the transmission signal to be transmitted to generate a predistorted transmission signal;
   wherein, due to the temporal extension of the error signal, an error signal segment in the frequency spectrum of a transmission signal transmitted by the nonlinear transmission path is shifted away from the useful frequency range of the trans-mission signal.

14. A method according to claim 13, wherein the temporal extension of the error signal is effected making use of a time-dispersive element, and wherein coefficients of the time-dispersive element are determined in advance from the transfer characteristic of the nonlinear transmission path.

15. A method for spectrally forming an interference spectrum of a transmission signal at the output of a power transmitter, said method comprising the steps of:
   generating an error signal from the transmission signal and a previously registered transfer characteristic of a power amplifier, wherein the error signal represents an estimate of an error generated due to a nonlinearity of the power amplifier and wherein the error signal is generated by combining the transmission signal with distortion coefficients obtained by accessing the previously registered transfer characteristic based on the transmission signal;

effecting a temporal extension of the error signal to generate a correction signal;

combining the correction signal and the transmission signal to generate a predistorted transmission signal, wherein, due to the temporal extension of the error signal, an error signal segment in the frequency spectrum of a transmission signal transmitted by the power amplifier is shifted away from the useful frequency range of the transmission signal; and feeding the predistorted transmission signal into the power amplifier.

16. A method according to claim 15, which also includes the step of performing bandpass filtering of an output signal output by the power amplifier.

17. A method according to claim 15, wherein the temporal extension of the error signal is effected making use a time-dispersive element, and wherein coefficients of the time-dispersive element are determined in advance from the transfer characteristic of the nonlinear transmission path.

* * * * *

UNITED STATES PATENT AND TRADEMARK OFFICE
CERTIFICATE OF CORRECTION

PATENT NO. : 7,170,951 B1 Page 1 of 1
APPLICATION NO. : 10/018755
DATED : January 30, 2007
INVENTOR(S) : Rainer Perthold et al.

It is certified that error appears in the above-identified patent and that said Letters Patent is hereby corrected as shown below:

On the cover page, item (75) please delete: "Maximilian Hofman" and replace with the following: --Maximillian Hofmann--

On the cover page, item (75) please delete: "Heinz Gerhafuser" and replace with the following: --Heinz Gerhaeuser--

Signed and Sealed this

Twenty-second Day of May, 2007

JON W. DUDAS
*Director of the United States Patent and Trademark Office*